United States Patent [19]

Choi et al.

[11] Patent Number: 5,716,879
[45] Date of Patent: Feb. 10, 1998

[54] METHOD OF MAKING A THIN FILM TRANSISTOR

[75] Inventors: Jong Moon Choi, Seoul; Jong Kwan Kim, Chungcheongbuk-do, both of Rep. of Korea

[73] Assignee: Goldstar Electron Company, Ltd., Cheongju, Rep. of Korea

[21] Appl. No.: 782,739

[22] Filed: Jan. 13, 1997

Related U.S. Application Data

[63] Continuation-in-part of Ser. No. 356,822, Dec. 15, 1994, abandoned.

[51] Int. Cl.$^6$ ............................................. H01L 21/86
[52] U.S. Cl. ............................. 438/40 TFI; 437/41 TFI; 437/34; 437/56; 437/164
[58] Field of Search ............. 437/40 TFI, 41 TFI, 437/40 TFT, 41 TFT, 56, 57, 58, 59, 34, 913, 164, 405 W, 415 W; 148/DIG. 150

[56] References Cited

U.S. PATENT DOCUMENTS

| | | | |
|---|---|---|---|
| 4,554,572 | 11/1985 | Chatterjee | 257/377 |
| 5,039,622 | 8/1991 | Ishihara | 437/40 TFI |
| 5,214,295 | 5/1993 | Manning | 437/915 |
| 5,283,455 | 2/1994 | Inoue et al. | 257/329 |
| 5,300,446 | 4/1994 | Fujioka | 437/915 |
| 5,348,897 | 9/1994 | Yen | 437/40 TFI |
| 5,385,854 | 1/1995 | Batra et al. | 437/913 |
| 5,432,102 | 7/1995 | Cho et al. | 437/21 |
| 5,518,945 | 5/1996 | Bracchitta et al. | 437/164 |
| 5,554,548 | 9/1996 | Sundaresan | 437/41 TFI |
| 5,574,294 | 11/1996 | Shepard | 437/40 TFI |

FOREIGN PATENT DOCUMENTS

| | | | |
|---|---|---|---|
| 02 301 47 | 1/1990 | Japan . | |
| 03 69168 | 3/1991 | Japan . | |
| 05 47788 | 2/1993 | Japan | 437/44 |

OTHER PUBLICATIONS

Shah et al., "A 2μm Stacked CMOS 64 K SRAM"; Syposium on VLSI Technology, pp. 8-9, Sep. 10-12, 1984.

*Primary Examiner*—Michael Trinh
*Attorney, Agent, or Firm*—Alan R. Loudermilk

[57] ABSTRACT

A structure and fabricating method of a thin film transistor which is suitable for an SRAM memory cell. The thin film transistor structure includes: an insulation substrate; a gate electrode formed on the insulation substrate; a gate insulation film formed on the gate electrode and on the insulation substrate; a semiconductor layer formed on the gate insulation film; channel regions formed in parts of the semiconductor layer at both sides of the gate electrode; a high density first conductive type first impurity region formed in the semiconductor layer over the gate electrode; and first conductive type second impurity regions of having an LDD structure formed in parts of the semiconductor layer over the insulation substrate except under the gate electrode. The method for fabricating a thin film transistor includes processes for: forming a gate electrode on an insulation substrate and forming a gate insulation film on the overall surface thereof; forming a semiconductor layer on the gate insulation film; forming diffusion preventing spacers on the semiconductor layer; forming impurity-containing spacers on the diffusion preventing spacers; diffusing impurities from the impurity-containing spacers into the semiconductor layer; and injecting high density source/drain ions into the semiconductor layer with the insulation film side walls used as masks.

20 Claims, 4 Drawing Sheets

METHOD OF MAKING A THIN FILM TRANSISTOR

This application is a continuation-in-part of application Ser. No. 08/356,822 filed on Dec. 15, 1994, now abandoned.

FIELD OF THE INVENTION

This invention relates to thin film transistors, and more particularly to a structure and fabricating method of a thin film transistor suitable for devices such as a SRAM memory cell.

BACKGROUND OF THE INVENTION

In general, P-type thin film transistors are used in SRAM devices of over 1M bit density in place of a load resistor. N-type thin film transistors are widely used in liquid crystal displays as a switching element for switching video data signals of each pixel region. To fabricate a high quality SRAM, a thin film transistor has to have its off current reduced and its on current increased in order for the SRAM to have reduced power consumption and improved memory characteristics. Based on the foregoing principles, studies on improving the on/off current ratio are actively underway.

A conventional method for fabricating a thin film transistor for improving the on/off current ratio based on the foregoing principles will be explained hereinafter, referring to the attached drawings. FIGS. 1A–1F are sections illustrating conventional fabricating processes of a thin film transistor.

A conventional fabricating process of a thin film transistor is as follows. As illustrated in FIG. 1A, gate electrode 2 is formed on insulation substrate 1 and gate insulation film 3 is formed on the surface thereof. Then, as illustrated in FIG. 1B, intrinsic semiconductor layer 4 is deposited on the overall surface thereof. As illustrated in FIG. 1C, channel ions (N-type ions) are injected into intrinsic semiconductor layer 4. As illustrated in FIG. 1D, after depositing first oxide film 5 on the overall surface thereof and carrying out a patterning (with a photoetching process) of first oxide film 5 to leave first oxide film 5 only on the channel region over gate electrode 2, low density source/drain ions (P–) are injected into intrinsic semiconductor layer 4 with patterned first oxide film 5 used as a mask.

As illustrated in FIG. 1E, after forming second oxide film side walls 7 through depositing a thick second oxide film on the overall surface thereof and carrying out an anisotropic etching of the second oxide film, high density source/drain ions (P+) are injected into intrinsic semiconductor layer 4 with patterned first oxide film 5 and second oxide film side walls 7 used as masks. As illustrated in FIG. 1F, by removing first oxide film 5 and second oxide film side walls 7, a thin film transistor of an LDD (Lightly Doped Drain) structure is completed.

The foregoing conventional thin film transistor, however, has the following problems. The thin film transistor has problems of low yield and degradation of characteristics due to the complicated processes and the increased number of steps resulting from the additionally required mask fabrication processes as well as the mask removal processes for forming the LDD structures of the source/drain regions.

SUMMARY OF THE INVENTION

The object of this invention, which is devised for solving the foregoing problems, may improve the yield and the characteristics of a thin film transistor by reducing the required number of processes.

These and other objects and features of this invention can be achieved by providing a thin film transistor structure including: an insulation substrate; a gate electrode formed on the insulation substrate; a gate insulation film formed on the gate electrode and on the insulation substrate; a semiconductor layer formed on the gate insulation film; channel regions formed in portions of the semiconductor layer at the sides of the gate electrode; a high density first conductive type first impurity region formed in the semiconductor layer over the gate electrode; and first conductive type second impurity regions having an LDD structure formed in portions of the semiconductor layer over the insulation substrate except under the gate electrode.

Objects of the present invention also are achieved by providing a method for fabricating a thin film transistor including processes for: forming a gate electrode on an insulation substrate and forming a gate insulation film on the overall surface thereof; forming a semiconductor layer on the gate insulation film; vertically injecting low density source/drain impurity ions into the semiconductor layer; forming insulation film side walls at the side walls of the semiconductor layer at the sides of the gate electrode; and injecting high density source/drain ions into the semiconductor layer with the insulation film side walls used as masks, such as described in parent application application Ser. No. 08/356,822, which is hereby incorporated by reference.

Other objects of the present invention are achieved by providing a method for fabricating a thin film transistor including processes for: forming a gate electrode having first and second sides on an insulation substrate; forming a gate insulation film on the gate electrode and the substrate; forming a semiconductor layer on the gate insulation film; forming diffusion-preventing spacers on the semiconductor layer corresponding or adjacent to the first and second sides of the gate electrode; forming impurity-containing spacers on the diffusion-preventing spacers and the semiconductor layer adjacent thereto; forming a low density impurity region in the semiconductor layer by diffusing impurities from the impurity-containing spacers; and injecting impurities in the semiconductor layer using the impurity-containing spacers as a mask to form high density impurity regions.

DETAILED DESCRIPTION OF THE INVENTION

Preferred embodiments of the present invention will be explained hereinafter in detail, referring to the attached drawings.

Figure 1A:
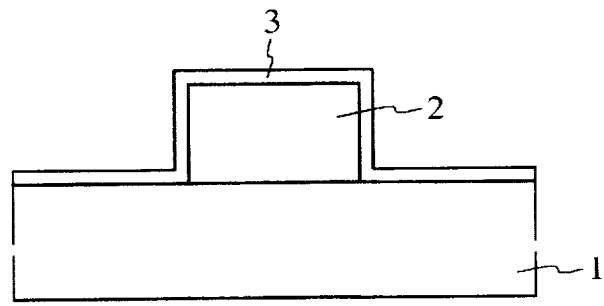
FIGS. 1A–1F are sections illustrating a conventional process for fabricating a thin film transistor.
Figure 1B:
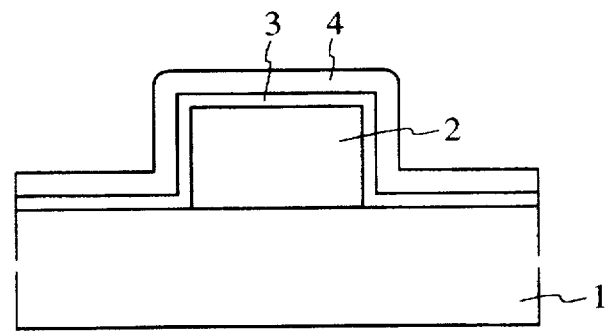
Figure 1C:
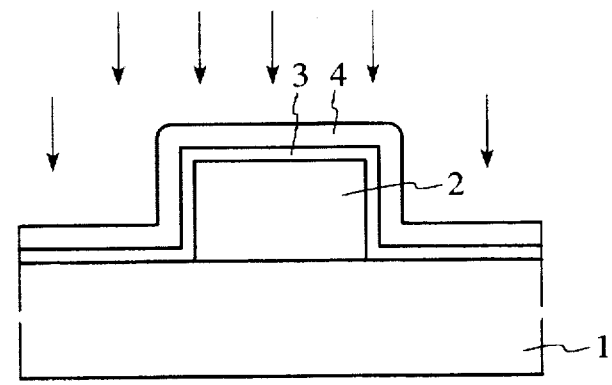
Figure 1D:
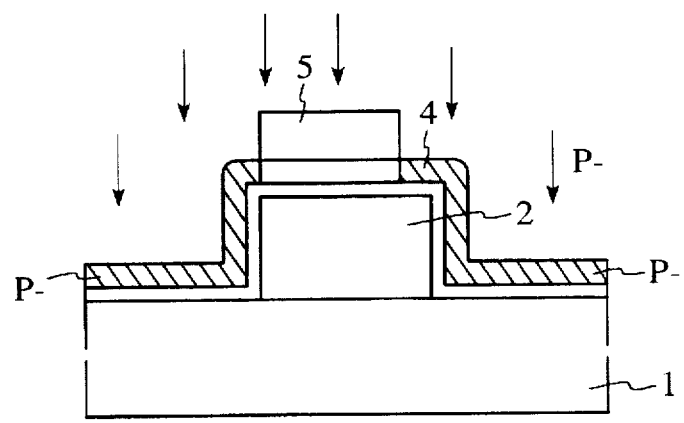
Figure 1E:
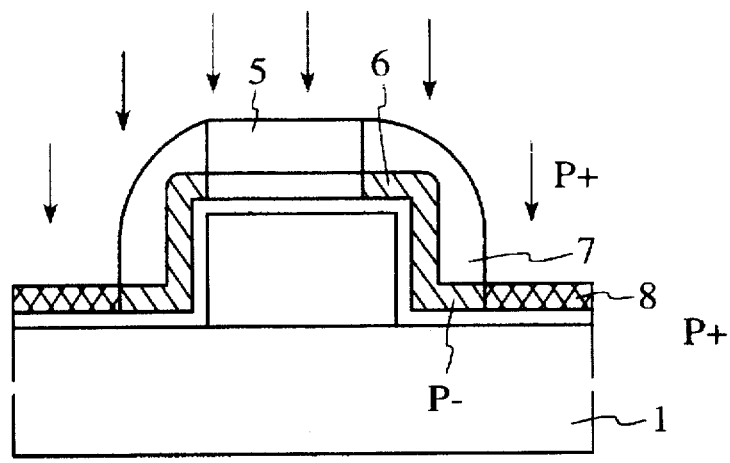
Figure 1F:
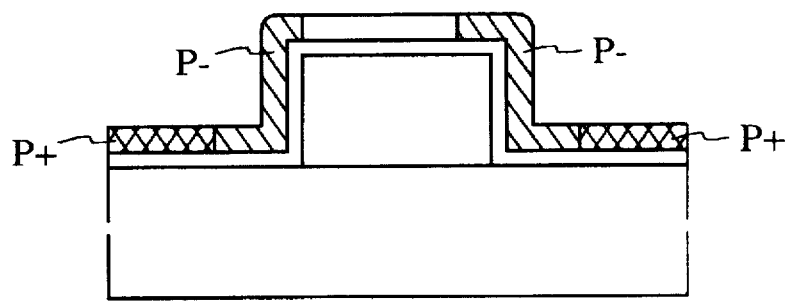
Figure 2:
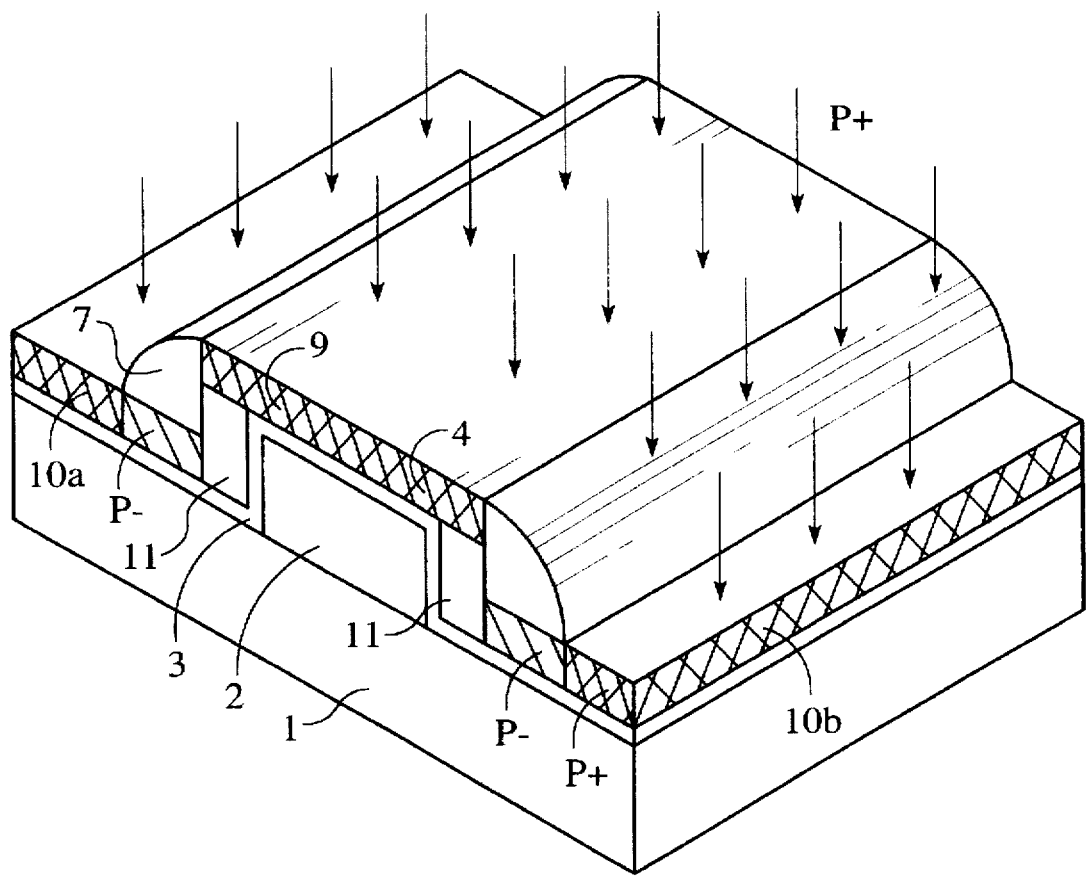
FIG. 2 is a perspective view of a thin film transistor generally in accordance with this invention.

FIG. 2 is a perspective view of a thin film transistor generally in accordance with this invention. FIGS. 3A–3E are sections illustrating a process for fabricating a thin film transistor in accordance with this invention.

As illustrated in FIG. 2, a thin film transistor structure in accordance with this invention includes: gate electrode 2 formed on insulation substrate 1 (which may be a substrate formed of an insulative material or a conductive or semiconductive substrate on which is formed an insulator); gate insulation film 3, which may be an oxide film, formed on gate electrode 2 and on insulation substrate 1; semiconductor layer 4 formed on gate insulation film 3; channel regions 11 of a transistor formed in parts of semiconductor layer 4 at both sides of gate electrode 2; insulation film side walls 7 formed on semiconductor layer 4 along the sides of gate electrode 2; high density P-type first impurity region 9 formed in the semiconductor layer over gate electrode 2, and P-type second impurity regions 10a and 10b having an LDD structure formed in parts of semiconductor layer 4 over the substrate except under gate electrode 2.

A method for fabricating a thin film transistor in accordance with this invention having a structure similar to that discussed above will be explained hereinafter.

Figure 3A:
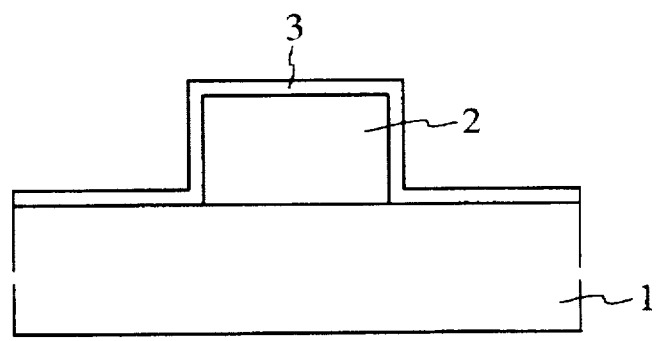
FIGS. 3A–3E are sections illustrating a process for fabricating a thin film transistor in accordance with this invention.

As illustrated in FIG. 3A, gate electrode 2 is formed on substrate 1 and gate oxide film 3 is formed on gate electrode 2 and substrate 1. Gate electrode 2 preferably is formed of an N-type doped polysilicon. Since the thickness (height) of gate electrode 2 serves to define the length of the channel region, the thickness of gate electrode 2 is adjusted considering the desired channel length.

Figure 3B:
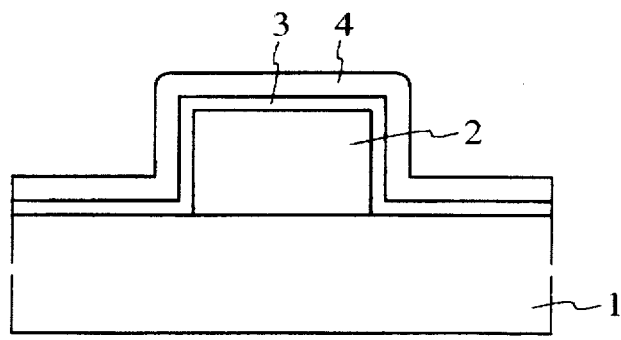
Figure 3C:
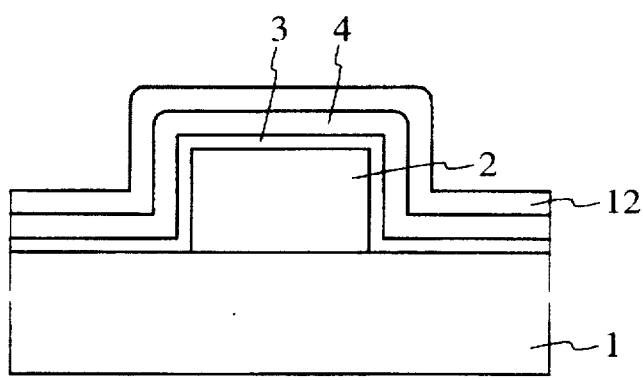
Figure 3D:
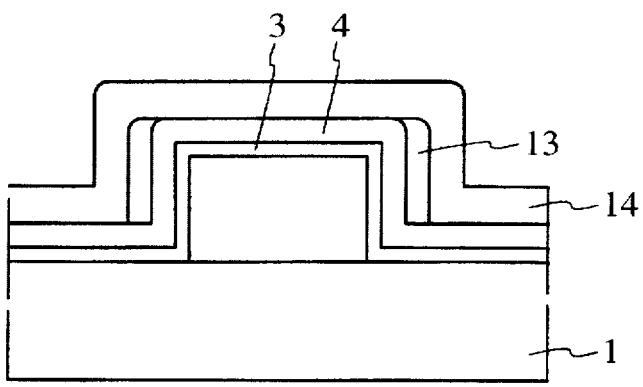

As illustrated in FIGS. 3B and 3C, semiconductor layer 4 is formed on gate oxide film 3, and oxide film 12 (which may be about 100–500 Å in thickness) is formed on semiconductor layer 4. Oxide film 12 may be formed by an oxidation process to form a thermal oxidation film on the surface of the semiconductor layer or by deposition of a CVD oxide. As illustrated in FIG. 3D, oxide film 12 is subjected to anistropic etching to form oxide film sidewalls 13 on the surface of semiconductor layer 4 opposite to the sides of gate electrode 2, and BSG (Boron Silicate Glass) layer 14 is formed on oxide film sidewalls 13 and semiconductor layer 4.

Figure 3E:
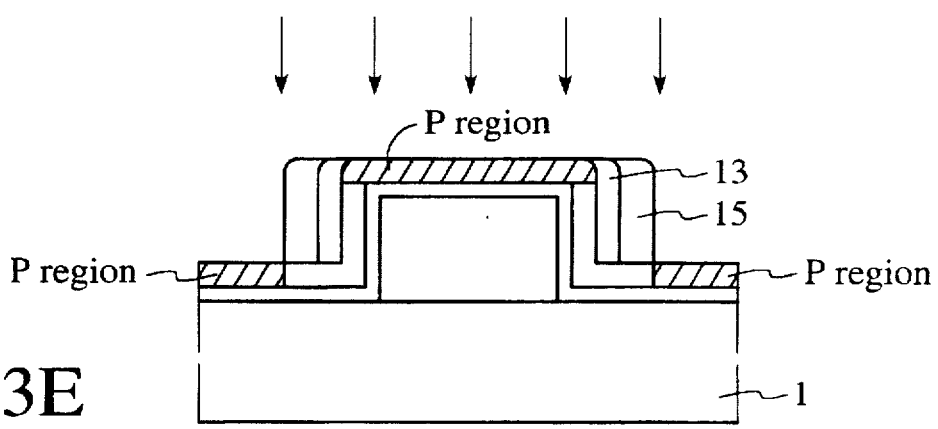

Referring to FIG. 3E, oxide film sidewalls 13 are used as diffusion-preventing layers for preventing the boron from being diffused to a channel region during diffusion of the boron in the BSG film into portions of semiconductor layer 4 that are in contact with BSG layer 14. BSG layer 14 is formed to a thickness of about 2000 Å or over, with a concentration of the boron therein being in the range of about $1\times10^{19}$–$1\times10^{21}$ atoms/cm$^3$. BSG layer 14 is subjected to anistropic etching to form BSG sidewalls 15 on oxide film sidewalls 13 and on semiconductor layer 4 adjoining oxide film sidewalls 13, and subjected to annealing at an elevated temperature over about 800° C. for more than about 10 minutes in a nitrogen ambient to diffuse the boron impurities in BSG sidewalls 15 into portions of semiconductor layer 4 that are in contact with BSG sidewalls 15, to form lightly doped P-type impurity regions in semiconductor layer 4. Ions are injected into semiconductor layer 4 using BSG sidewalls 15 as masks to form heavily doped P-type impurity regions in semiconductor layer 4 as illustrated. The width of each of BSG sidewalls 15 is greater than about 2000 Å, the concentration of the resulting lightly doped P-type impurity regions is about $1\times10^{18}$–$1\times10^{20}$ atoms/cm$^3$, and the dose in the formation of the heavily doped P-type impurity regions is about $1\times10^{13}$–$1\times10^{16}$ atoms/cm$^2$, which is equivalent to a concentration of about $1\times10^{20}$–$1\times10^{22}$ atoms/cm$^3$. BSG may be applied for forming the lightly doped P-type impurity regions in the case of a PMOS device, and PSG (Phosphorous Silicate Glass) may be applied for forming the lightly doped N-type impurity regions in the case of an NMOS device.

A preferred embodiment of the present invention uses BSG sidewalls in the formation of the lightly doped P-type impurity regions, which may serve to prevent an adverse effect on the channel region, which is formed vertically. If high energy ions are injected, for example, the impurities may be diffused even to the channel region, resulting in an undesired change of the Vt (Threshold Voltage), which may degrade the performance of the device. The gate electrode may be doped with P-type (boron) impurities in case of a PMOS device, and with N-type (phosphorous) impurities in case of an NMOS device for obtaining a stable Vt characteristic.

Moreover, if an impurity region is formed with such a process, a drain region, being offset to the gate electrode, is produced with an LDD structure.

The structure and fabricating method of a thin film transistor in accordance with this invention as in the foregoing explanation has the following advantages.

First, since it is possible to form a drain region of an LDD structure in self-alignment without a masking process, a thin film transistor having constant characteristics can be obtained irrespective of variation of the process.

Second, since no masking process as well as no removal process are required, the process is simple and the yield is increased.

Third, since the channel is vertically formed, even though the design rule may be scaled down, a thin film transistor having a fixed length channel can be secured.

Another embodiment for forming a thin film transistor of such a structure in accordance with the present invention is disclosed in FIGS. 3A to 3D of parent application Ser. No. 08/356,822, which is hereby incorporated by reference.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a thin film transistor comprising the steps of:

forming a gate electrode having first and second sides on an insulation substrate;

forming a gate insulation film on the gate electrode;

forming a semiconductor layer on the gate insulation film;

forming diffusion-preventing spacers on the semiconductor layer adjacent to the first and second sides of the gate electrode;

forming impurity-containing spacers adjacent to the diffusion-preventing spacers and on the semiconductor layer;

forming low density impurity regions in the semiconductor layer by diffusing impurities from the impurity-containing spacers into the semiconductor layer; and, injecting impurities in the semiconductor layer using the impurity-containing spacers as a mask, wherein high density source/drain impurity regions are formed in the semiconductor layer.

2. The method of claim 1, wherein the transistor has channel regions formed in the semiconductor layer along the first and second sides of the gate electrode, wherein the channel regions of the thin film transistor have a length based on a thickness of a gate electrode.

3. The method of claim 1, wherein a concentration of the low density impurity region is about $1\times10^{18}$–$1\times10^{20}$ atoms/cm$^3$.

4. The method of claim 1, wherein the injected impurities comprise $BF_2$, and the impurities are injected with an energy of about 5–50 KeV and a density of over about $1\times10^{13}$ atoms/$cm^2$.

5. The method of claim 1, wherein the semiconductor layer comprises polysilicon.

6. The method of claim 1, wherein the diffusion-preventing spacers include an insulation layer.

7. The method of claim 6, wherein the insulation layer comprises an oxide layer.

8. The method of claim 1, wherein the impurity-containing spacers comprise boron silicate glass.

9. The method of claim 8, wherein a boron concentration of the boron silicate glass is about $1\times10^{18}$–$1\times10^{20}$ atoms/$cm^3$.

10. The method of claim 1, wherein the step of diffusing impurities from the impurity-containing spacers comprises annealing at a temperature of over about 800° C. for about 10 minutes in a nitrogen ambient.

11. The method of claim 1, wherein the impurity-containing spacers have a width over about 2000 Å.

12. The method of claim 1, wherein the method of forming the diffusion-preventing spacers further comprises the steps of:

forming an insulation layer on the semiconductor layer; and anisotropically etching the insulation layer, wherein diffusion-preventing spacers are formed on the semiconductor layer adjacent to the first and second sides of the gate electrode.

13. The method of claim 12, wherein the insulation layer is formed to a thickness of about 100 to 500 Å.

14. The method of claim 1, wherein the step of forming the impurity-containing spacers further comprises the steps of:

forming an impurity-containing layer on the diffusion-preventing spacers; and anisotropically etching the impurity-containing layer, wherein the impurity-containing spacers are formed adjacent to the diffusion-preventing spacers.

15. The method of claim 14, wherein the impurity-containing layer has a thickness of over about 2000 Å.

16. A method of forming a thin film transistor, comprising the steps of:

forming a gate electrode having at least a first side on a substrate;

forming a gate insulation film on the gate electrode including on the first side of the gate electrode;

forming a semiconductor layer on the gate insulation film;

forming a first sidewall film on the gate insulation film adjacent to the first side of the gate electrode;

forming a second sidewall film adjacent to the first sidewall film and on the semiconductor layer, wherein the second sidewall film contains impurities;

forming a first impurity region in the semiconductor layer by diffusing impurities from the second sidewall film into the semiconductor layer; and injecting impurities into the semiconductor using the first and second sidewall film as a mask, wherein a second impurity region is formed in the semiconductor layer, wherein the thin film transistor having a lightly doped drain structure is formed.

17. The method of claim 16, wherein the substrate comprises an insulative material.

18. The method of claim 16, wherein the substrate comprises a conductive or semiconductive material having an insulator formed thereon, wherein the gate electrode is formed on the insulator.

19. The method of claim 17, wherein the impurities in the second sidewall film comprise boron, wherein the thin film transistor comprises a P-type transistor.

20. The method of claim 19, wherein the impurities in the second sidewall film comprise phosphorous, wherein the thin film transistor comprises an N-type transistor.

* * * * *